United States Patent [19]
Leeman

[11] Patent Number: 5,859,858
[45] Date of Patent: Jan. 12, 1999

[54] METHOD AND APPARATUS FOR CORRECTING A MULTILEVEL CELL MEMORY BY USING ERROR LOCATING CODES

[75] Inventor: Daniel H. Leeman, Folsom, Calif.

[73] Assignee: Intel Corporation, Santa Clara, Calif.

[21] Appl. No.: 740,247

[22] Filed: Oct. 25, 1996

[51] Int. Cl.⁶ .................................................. G11C 11/34
[52] U.S. Cl. ........................................................ 371/21.4
[58] Field of Search ................................. 371/21.4, 21.1, 371/40.2, 21.2, 22.5, 48, 3, 37.01, 37.3, 37.4, 37.7, 40.13, 56; 365/185.03, 201; 395/181, 185.05, 182.04, 182.06

[56] References Cited

U.S. PATENT DOCUMENTS

| | | | |
|---|---|---|---|
| 5,450,363 | 9/1995 | Christopherson et al. | 365/205 |
| 5,475,693 | 12/1995 | Christopherson et al. | 371/10.2 |
| 5,511,078 | 4/1996 | Barucchi et al. | 371/40.1 |
| 5,541,886 | 7/1996 | Hasbun | 365/230.01 |
| 5,550,849 | 8/1996 | Harrington | 371/37.1 |
| 5,555,250 | 9/1996 | Walker et al. | 371/40.1 |
| 5,621,682 | 4/1997 | Tanzawa et al. | 365/185.03 |

OTHER PUBLICATIONS

Jack K. Wolf, "On Codes Derivable from the Tensor Product of Check Matrices", Apr., 1965, IEEE Transactions On Information Theory, pp. 281–284.

J.K. Wolf, B. Elspas, "Error–Locating Codes—A New Concept in Error Control", Apr., 1963, IEEE Transactions on Information Theory, pp. 113–117.

Nitin H. Vaidya, Dhiraj K. Pradhan, "A New Class of Bit–and Byte–Error Control Codes", Sep. 1992, IEEE Transactions on Information Theory, vol. 38, No. 5, pp. 1617–1623.

Douglas C. Bossen, et al., "Measurement and Generation of Error Correcting Codes for Package Failures", Mar., 1978, IEEE Transactions on Computers, vol. C–27, No. 3, pp. 201–204.

Eiji Fujiwara, et al., "A Class of Error–Locating Codes for Byte–Organized Memory Systems", Nov., 1994, IEEE Transactions on Information Theory, vol. 40, No. 6, pp. 1857–1865.

*Primary Examiner*—Robert W. Beausoliel, Jr.
*Assistant Examiner*—Nadeem Iqbal
*Attorney, Agent, or Firm*—Charles Young

[57] ABSTRACT

A method and apparatus corrects data read from a multilevel cell memory. The multilevel cell is capable of storing three or more charge states. A first charge state read from the multilevel cell is determined to be erroneous. An output is provided corresponding to that which would be provided if the multilevel cell were maintaining a second charge state, wherein the second charge state has more charge than the first charge state.

13 Claims, 10 Drawing Sheets

METHOD AND APPARATUS FOR CORRECTING A MULTILEVEL CELL MEMORY BY USING ERROR LOCATING CODES

FIELD OF THE INVENTION

The present invention relates to the field of memory devices. More particularly, this invention relates to correcting an error in data read from a multilevel cell memory.

BACKGROUND OF THE INVENTION

A multilevel cell memory is comprised of multilevel cells, each of which is able to store multiple charge states, or levels. Each of the charge states is associated with a memory element bit pattern.

Figure 1:
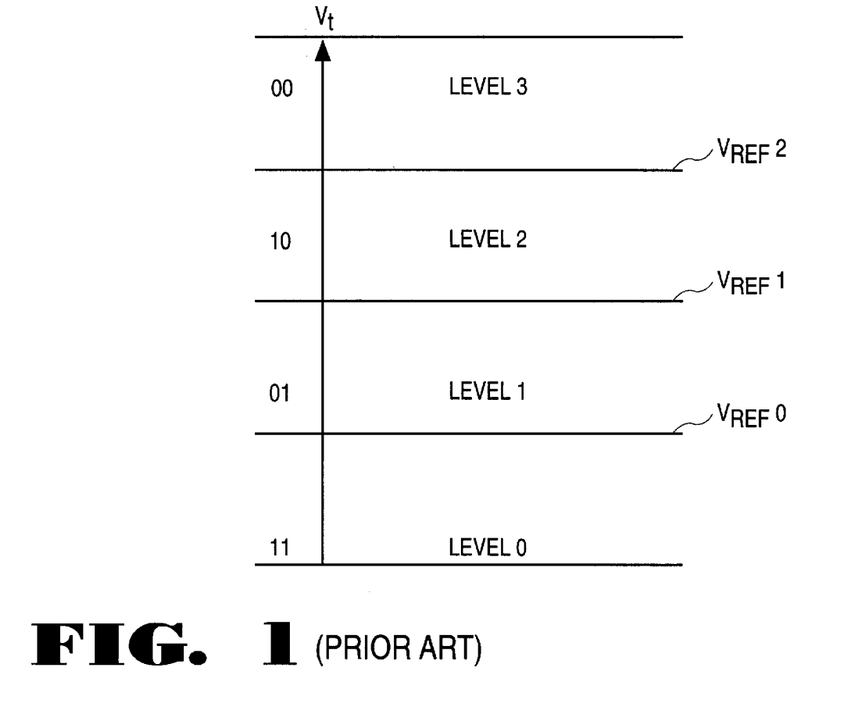
FIG. 1 shows a representation of a prior art multilevel cell that stores four charge states.

FIG. 1 shows a representation of a prior art multilevel cell that stores four charge states: Levels 0–3. Level 3 maintains a higher charge than level 2; level 2 maintains a higher charge than level 1; level 1 maintains a higher charge than level 0. A reference voltage separates the various charge states. Vref2 separates level 3 and level 2. Vref1 separates level 2 and level 1. Vref0 separates level 1 and level 0.

Each charge state has an associated memory element bit pattern. For one implementation, the memory element bit pattern '00' is associated with level 3, the memory element bit pattern '10' is associated with level 2, the memory element bit pattern '01' is associated with level 1, and the memory element bit pattern '11' is associated with level 0.

A multilevel cell memory is able to store more than one bit of data based upon the number of charge states that it can store. For example, a multilevel cell memory that can store four charge states can store two bits of data; a multilevel cell memory that can store eight charge states can store three bits of data; a multilevel cell memory that can store sixteen charge states can store four bits of data. For each of the n-bit multilevel cell memories, various memory element bit patterns can be implemented to be associated with each of the different charge states.

The number of charge states storable in a multilevel cell, however, is not limited to powers of two. For example, a multilevel cell with three charge states stores 1.5 bits of data. When this multilevel cell is combined with additional decoding logic and coupled to a second similar multilevel cell, three bits of data are provided as output of the two-cell combination. Various other multi-cell combinations are also possible.

One example of a multilevel cell memory is described in U.S. Pat. No. 5,450,363, entitled "Gray Coding for a Multilevel Cell Memory System," by Christopherson et al., and issued to the common assignee of this application. The '363 patent describes one implementation of a multilevel cell memory. Multilevel cell memories can be used in Dynamic Random Access Memory (DRAM) and various types of Read-Only Memory (ROM), such as an Erasable Programmable Read-Only Memory (EPROM), an Electrically Erasable Programmable Read-Only Memory (EEPROM), and flash Erasable Programmable Read-Only Memory (flash EPROM).

Figure 2:
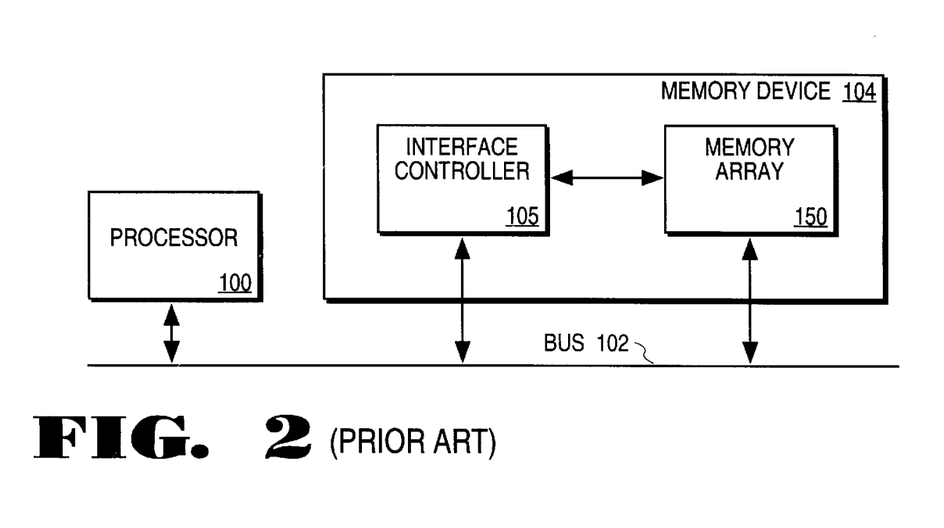
FIG. 2 shows a prior art representation of a processor and a multilevel cell memory.

FIG. 2 shows a prior art representation of a processor 100 and multilevel cell memory 104. A processor 100 is coupled to a bus 102 and the memory 104. The memory 104 contains an interface controller 105 and a multilevel cell memory array 150. The processor 100 is coupled via the bus 102 to the interface controller 105. The processor 100 is also coupled via the bus 102 to the multilevel cell memory array 150. The interface controller 105 provides the necessary operations to control the multilevel cell memory array 150. For one embodiment, the interface controller 105 and multilevel cell memory array 150 are located on a single integrated circuit die.

Error Codes

Data is typically provided to a particular memory array and retrieved from the memory array in a unit comprising a predetermined number of bits, referred to herein as a "data word". When the data is stored in the memory array, an encoder is sometimes used to generate error codes. The error codes can be stored such that they can be retrieved with their associated data word. When the data words are retrieved from the memory array, error decoding circuitry uses the previously-saved error codes associated with the data words for detecting, locating, and/or correcting errors found in the data words as read from the memory array, as is well-known in the prior art.

There are different types of error codes, including error detection codes, error locating codes, and error correction codes. Error detection codes detect whether an error occurred, but cannot correct the error. Error locating codes detect an error, and are able to localize the error to a block of bits, but cannot determine the precise position of the erroneous bit within the block of bits. Error correction codes detect single bit error in a data word and are able to correct the errors. One type of error correction code, called a Hamming code, besides being able to correct single bit errors, is additionally able to detect (but not correct) double bit errors in a data word.

One group of error locating codes is described in "A Class of Error-Locating Codes for Byte-Organized Memory Systems," by E. Fujiwara and M. Kitakami ("Fujiwara"), IEEE Transactions on Information Theory, Vol. 40, No. 6, November 1994. Fujiwara describes error locating codes used in a fault tolerant memory system. When an error is detected in a block of memory, the erroneous memory card is located and then switched to a spare one.

Error locating codes are also described in "Error-Locating Codes-A New Concept in Error Control," by J. K. Wolf and B. Elspas, IEEE Transactions on Information Theory, April 1963.

SUMMARY OF THE INVENTION

A method and apparatus corrects data read from a multilevel cell of a memory. The multilevel cell is capable of storing three or more charge states. A first charge state read from the multilevel cell is determined to be erroneous. An output is provided corresponding to that which would be provided if the multilevel cell were maintaining a second charge state, wherein the second charge state has more charge than the first charge state.

Other features and advantages of the present invention will be apparent from the accompanying drawings and from the detailed description that follows below.

DETAILED DESCRIPTION

A method and apparatus for correcting errors in a multilevel cell memory is described. The method makes use of error locating codes to correct errors in a data word read from one or more multilevel cells. The error locating codes indicate a block of bits within the data word that contain an error but does not identify which bit is erroneous. Since the block of bits corresponds to one or more multilevel cells, the error locating codes identify an erroneous multilevel cell. The invention utilizes the identification of the erroneous multilevel cell, and combines this with the recognition that a main failure mechanism of a multilevel cells is charge loss. Once a particular multilevel cell has been identified as being incorrectly read, the correct state of the multilevel cell can be predicted to be a charge state having more charge than the charge state that was read from the multilevel cell.

Whereas the error locating codes in Fujiwara (cited in the Background) were used to detect a block of memory that was erroneous so that the memory card storing the block of memory could be disabled, the present invention makes use of the failure mechanism of the multilevel cells in order to correct the failure. Because the normal failure mode of multilevel cells is unidirectional based on charge loss, instead of random as described in Fujiwara, the present invention has discovered that predicting the correct state of erroneous multilevel cells is possible.

Correction of an erroneous multilevel cell is achieved by modifying the data read from the erroneous multilevel cell to reflect the value it would have been if the erroneous multilevel cell were at the next higher charge state. The error locating codes are used to check whether the modification corrects the error. If the modified data from the erroneous multilevel cell is still incorrect, then this modification process may be repeated. If multiple multilevel cells are erroneous, then the data from one multilevel cell can be held constant while the other is modified or vice versa until the error has been corrected.

Throughout the description of the invention, the error locating codes as described in Fujiwara are cited as one example of implementation. However, other algorithms and other types of implementations may also be used to identify an erroneous multilevel cell.

Figure 3:
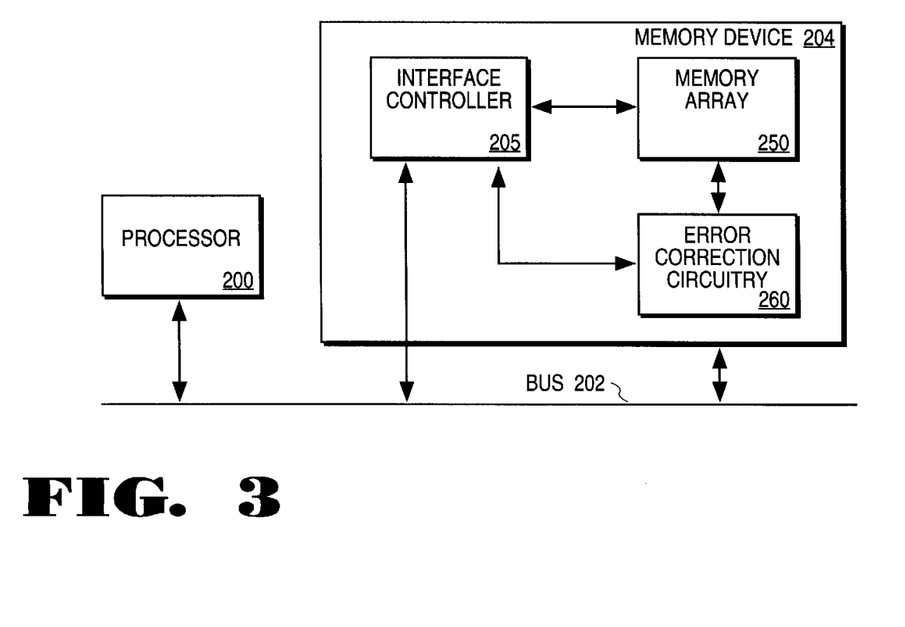
FIG. 3 shows a representation of a processor and a multilevel cell memory employing the present invention.

FIGS. 3–9 show sample implementations of the invention. FIG. 3 shows a representation of a processor 200 and multilevel cell memory 204. The processor 200 is coupled to a bus 202. The multilevel cell memory 204 comprises an interface controller 205, a multilevel cell memory array 250, and error correction circuitry 260. The interface controller 205 is coupled to provide the necessary operations to control the multilevel cell memory array 250 and the error correction circuitry 260. Both the interface controller 205 and the error correction circuitry 260 are coupled to the bus 202. The multilevel cell memory array 250 is coupled to the error correction circuitry 260. The processor 200 writes data to the memory 204 and reads data from the memory 204.

For one embodiment, the interface controller 205, the multilevel cell memory array 250, and the error correction circuitry 260 are located on a single integrated circuit die. For another embodiment, the error correction circuitry 260 is separate from the memory array 250 and the interface controller 205. For example, the error correction circuitry could reside on a separate chip.

Figure 4:
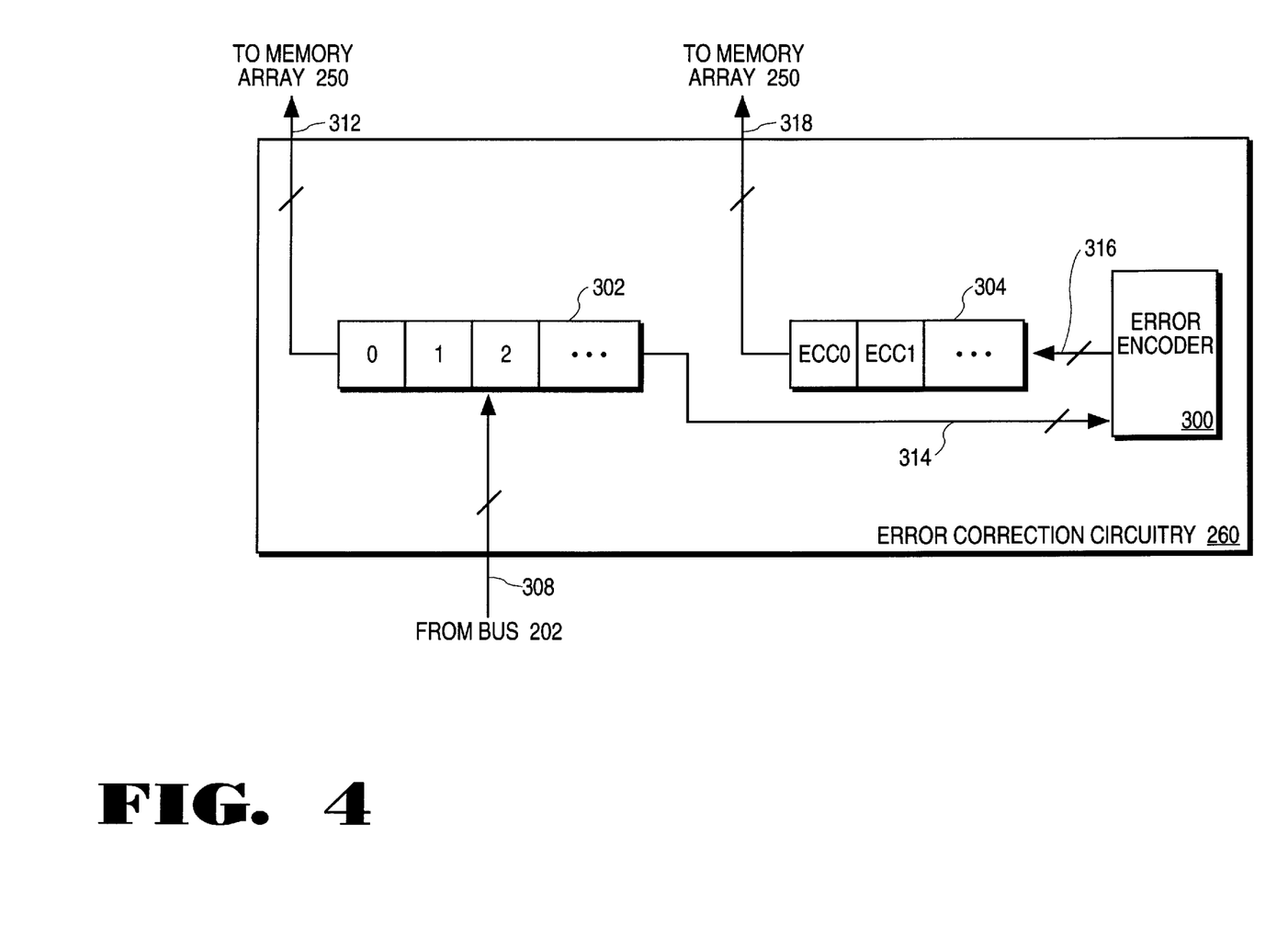
FIG. 4 shows an embodiment of error correction circuitry used for programming (i.e., writing) data to the memory array.

FIG. 4 shows an embodiment of error correction circuitry 260 used for programming (i.e., writing) data to the memory array 250. The error correction circuitry 260 includes a data buffer 302, an error buffer 304, and an error encoder 300.

The bus 202 is coupled to the data buffer 302 via data buffer bus 308. The data buffer 302 is coupled to the memory array 250 via memory bus 312. The data buffer is coupled to the error encoder 300 via bus 314. The error encoder 300 is coupled to the error buffer 304 via bus 316, and the error buffer 304 is coupled to the memory array 250 via the error bus 318.

Data is written to the data buffer 302 via the data buffer bus 308. Each transfer of data over the data buffer bus 308 is typically a fraction of the width of the data buffer 302. For example, data buffer bus 308 may be 8 bits or 16 bits wide, and the data buffer 302 may be 64 bits wide.

When the entire width of the data buffer 302 has been written with data from the bus 202, the 64-bit data word in the data buffer 302 is transferred to the memory array 250 via the memory bus 312. The error encoder 300, using the data input via bus 314 from the data buffer 302, generates an error correction code that is provided to the error buffer 304. The error buffer 304 provides the error correction code via the bus 318 to the memory array 250.

For one embodiment of the invention, the error encoder 300 generates error locating codes, which are a class of error correction codes such as those described in "A Class of Error-Locating Codes for Byte-Organized Memory Systems," by E. Fujiwara and M. Kitakami, IEEE Transactions on Information Theory, Vol. 40, No. 6, November 1994. Error locating codes detect one or more erroneous blocks of data within a data word, but do not indicate the exact bits of the blocks that are in error. Additionally, the error locating codes may detect single bit errors.

For one implementation of the present invention, the data word provided by the data buffer 302 and the error code provided by the error buffer 304 are stored contiguously in memory array 250. For another implementation, the data word is stored separately from the error code within the memory array 250. For yet another implementation, the error code is stored in a separate storage area from its associated data word.

Figure 5:
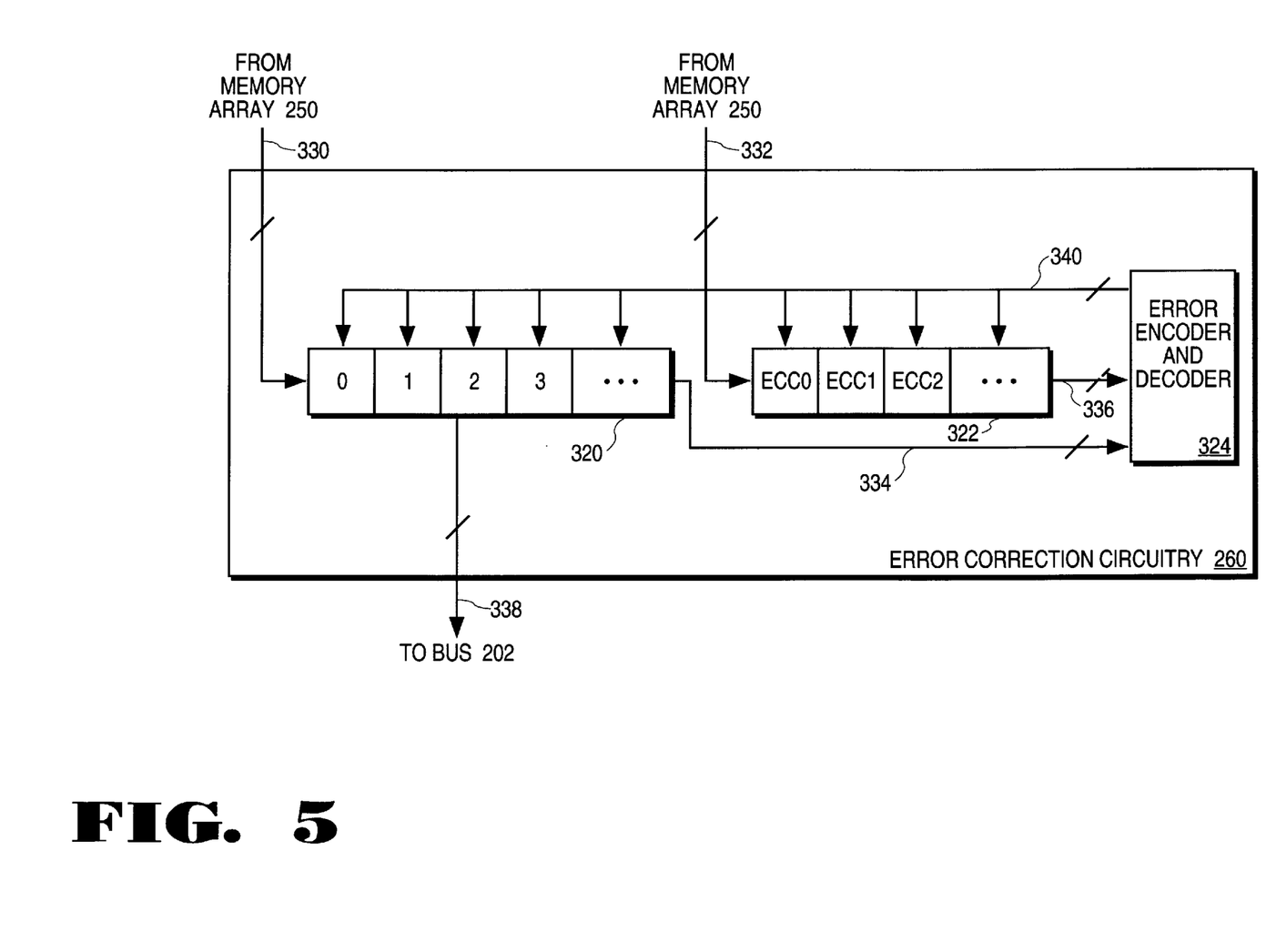
FIG. 5 shows an embodiment of error correction circuitry used for reading data from the memory array 250.

FIG. 5 shows an embodiment of error correction circuitry 260 that is used for reading data from the memory array 250. The error correction circuitry 260 includes a data buffer 320, an error buffer 322, and an error encoder and decoder (EED) 324.

During a read operation, a data word is provided from the memory array 250 via bus 330 to the data buffer 320.

Similarly, the data word's associated error correction code is provided to error buffer 322. For one embodiment, the error correction code is provided from the memory array 250 via bus 332.

The data buffer 320 is coupled to provide its data to the EED 324 via bus 334. The error buffer 322 is coupled to provide its error correction code to the EED 324 via bus 336. The EED 324 upon receiving inputs from both the data buffer 320 and the error buffer 322, determines whether there are any erroneous bits in the data word that was read from the memory array. If there are any erroneous bits in the data word, then the EED 324 asserts the appropriate signals 340 to correct the erroneous bits, as will be described with respect to FIGS. 11 and 12. The signals 340 can individually change any of the data bits of the data buffer 320. The EED 324 may need to iteratively test various data values in the data buffer 320 before determining a final data value that no longer has erroneous bits. The data buffer 320 is coupled to bus 202 via bus 338.

Figure 6:
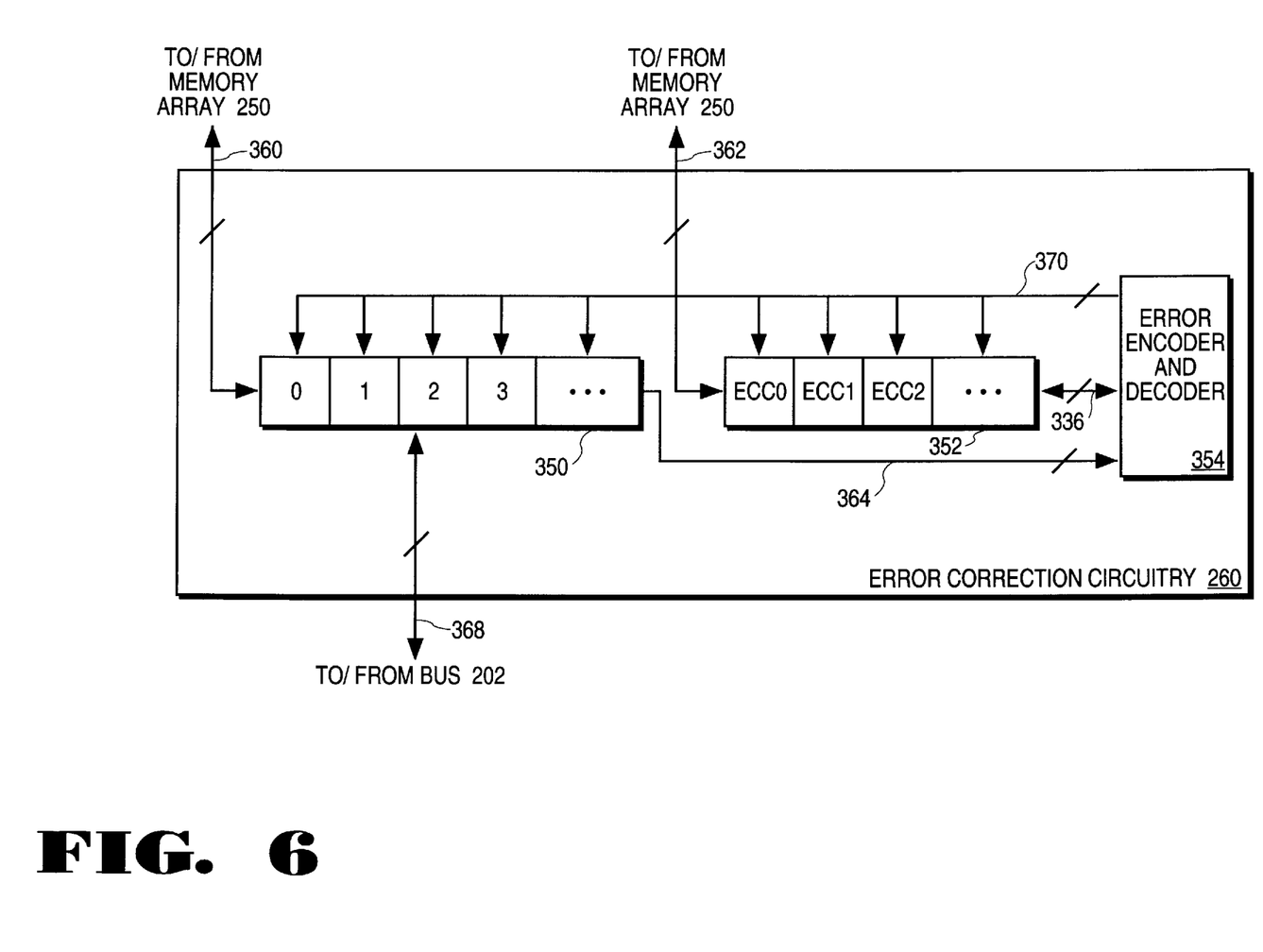
FIG. 6 shows an embodiment of error correction circuitry including a data buffer and an error encoder and decoder (EED) that can be used for both writing to the memory array and reading from the memory array.

FIG. 6 shows an embodiment of error correction circuitry 260 including a data buffer 350 and an error encoder and decoder (EED) 354 that can be used for both writing to the memory array 250 and reading from the memory array 250. The EED 354 includes an encoder for generating the error locating codes from the data word, and a decoder which is used for correcting the data word when reading from the memory array.

Figure 7:
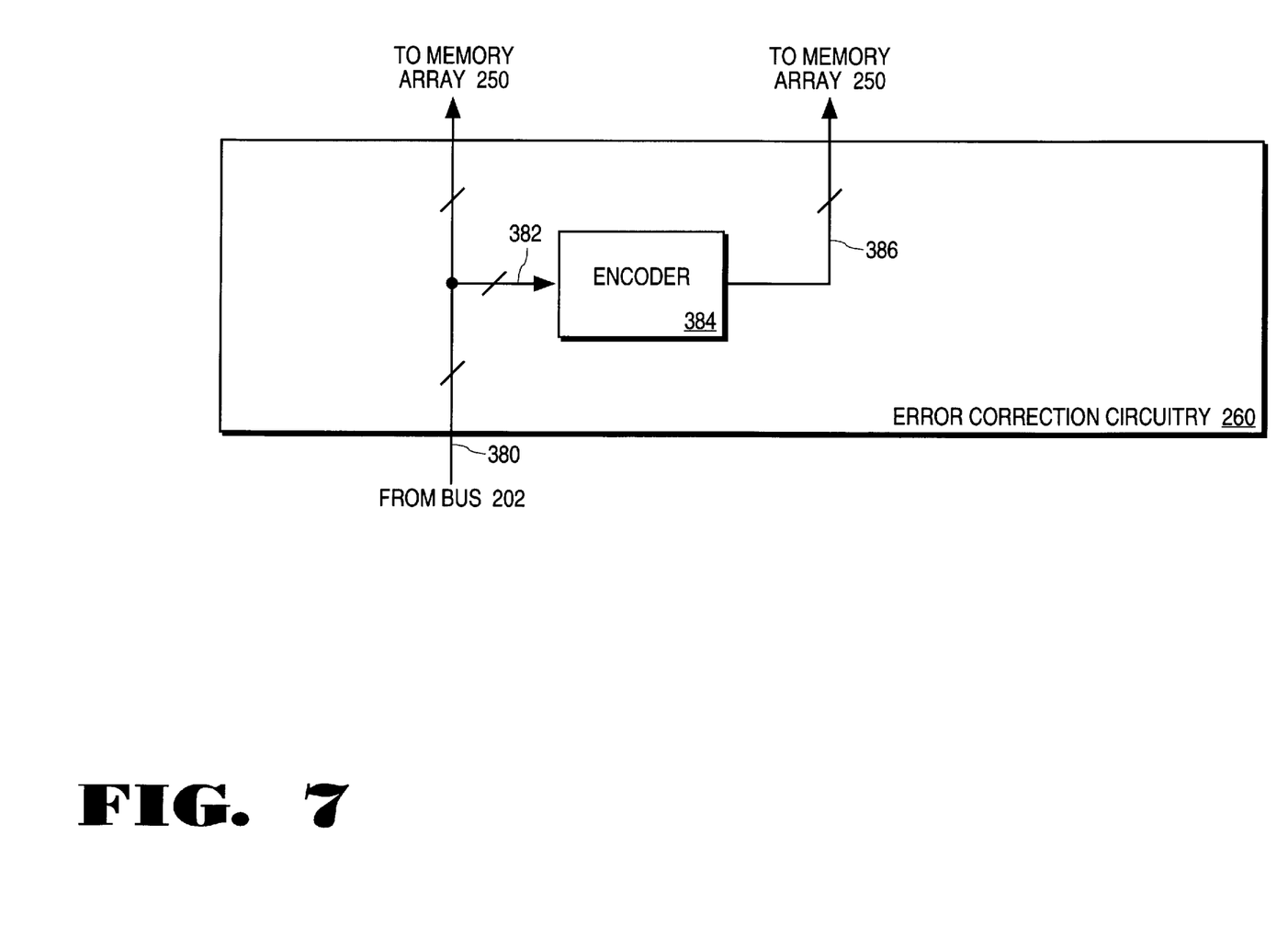
FIG. 7 shows another embodiment of error correction circuitry for writing data to the memory array.

FIG. 7 shows another embodiment of error correction circuitry 260 for writing data to the memory array 250. The error correction circuitry 260 of FIG. 7, however, does not include the data buffer or error buffer of FIG. 4. The data word is provided from bus 202 to the memory array 250 via bus 380. The data word is also provided as an input to the encoder 384 via bus 382. The encoder 384 generates error locating codes and provides them to the memory array 250 via bus 386. This embodiment may be employed when the encoder 384 has sufficient time to generate the error correction codes before the input data to the encoder 384 is changed.

Figure 8:
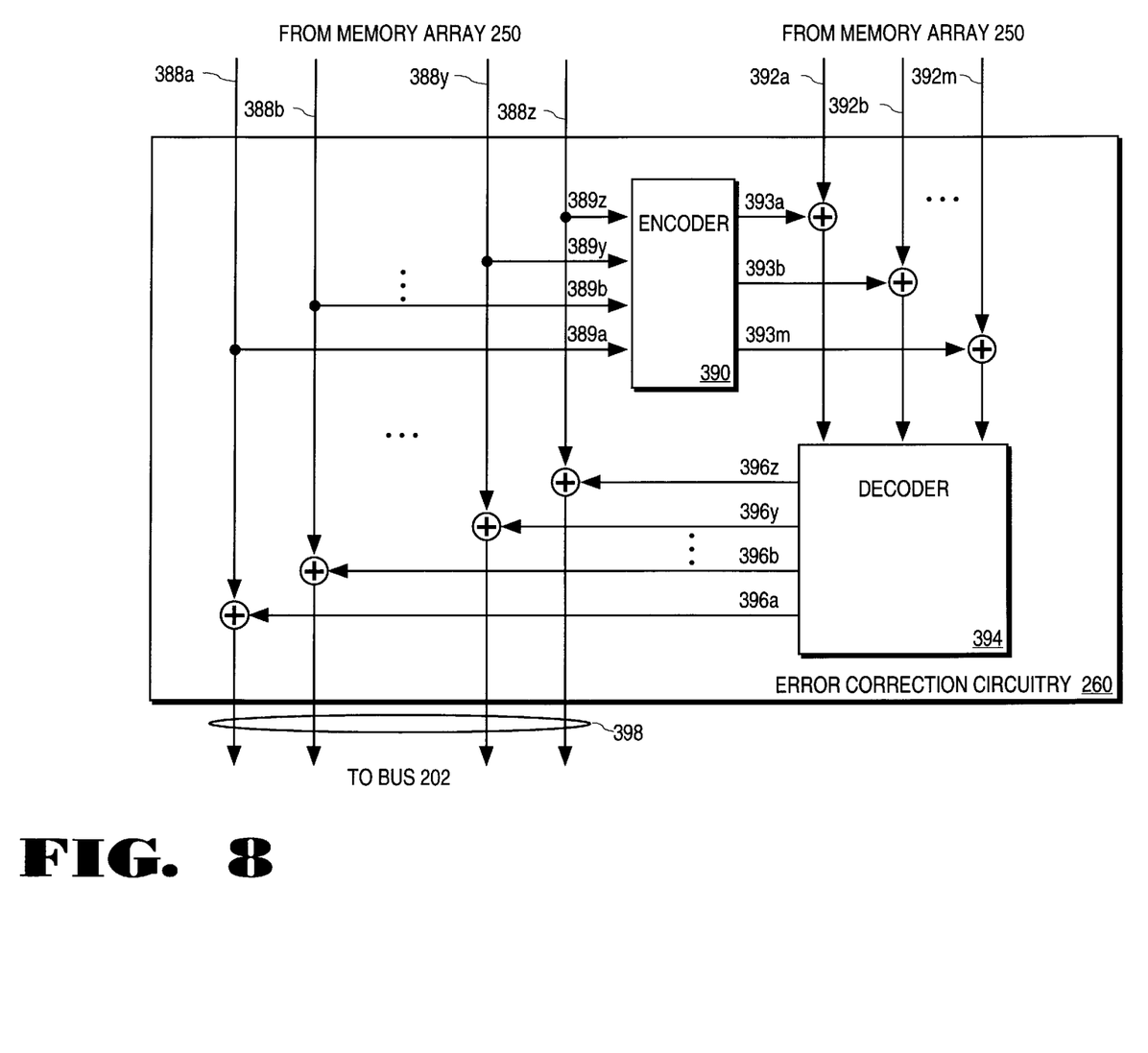
FIG. 8 shows another embodiment of error correction circuitry for reading data from the memory array.

FIG. 8 shows another embodiment of error correction circuitry 260 for reading data from the memory array 250. The error circuitry 260 of FIG. 8 does not include the data buffer or error buffer of FIG. 5.

A data word is provided from the memory array 250 to the error correction circuitry 260 via signal lines 388*a–z*. The data word is provided to the encoder 390 via signal lines 389*a–z*. The encoder re-encodes the data word and provides error correction codes on signal lines 393*a–m*. The re-encoded error correction codes are compared against the error correction codes that had been previously saved and which are provided on signal lines 392*a–m*. The comparison can be performed with XOR circuitry, for example. The output of the comparison is provided to a decoder 394. The decoder provides signals 396*a–z* which can modify the original signals 388*a–z* to correct errors detected in the data word. The corrected data word is provided to bus 202 via signal lines 398.

For an alternate embodiment, the programming circuitry of FIG. 7 and the reading circuitry of FIG. 8 can be combined to share an encoder.

Figure 9:
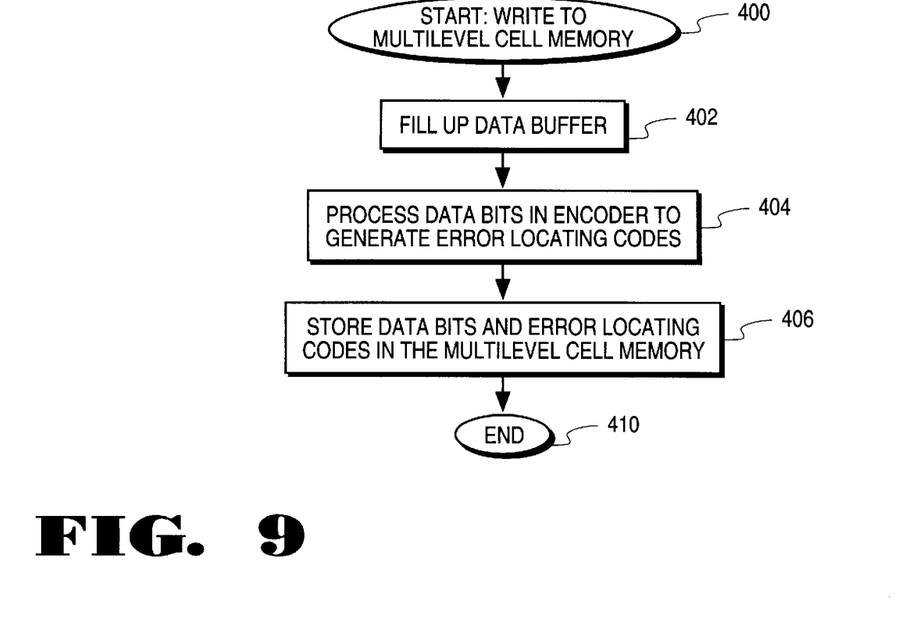
FIG. 9 shows a flowchart of the process of generating error correction codes when a data word is written to the multilevel cell memory.

FIG. 9 shows a flowchart showing the steps taken in generating error correction codes when a data word is written to the multilevel cell memory. The following description is made with reference to the programming circuitry of FIG. 4. The flowchart starts at block 400, from which operation continues at block 402. At block 402, the data buffer 302 is filled with data making up a data word. Writing to the data buffer 302 may take several bus cycles because the data bus buffer 308 typically is not as wide as the data buffer 302.

Operation continues at block 404 at which the bits of the data word are processed by the encoder 300 to generate an error locating code. At block 406, the data word and the error locating code are stored in the multilevel cell memory 204. Operation terminates at block 410.

Figure 10:
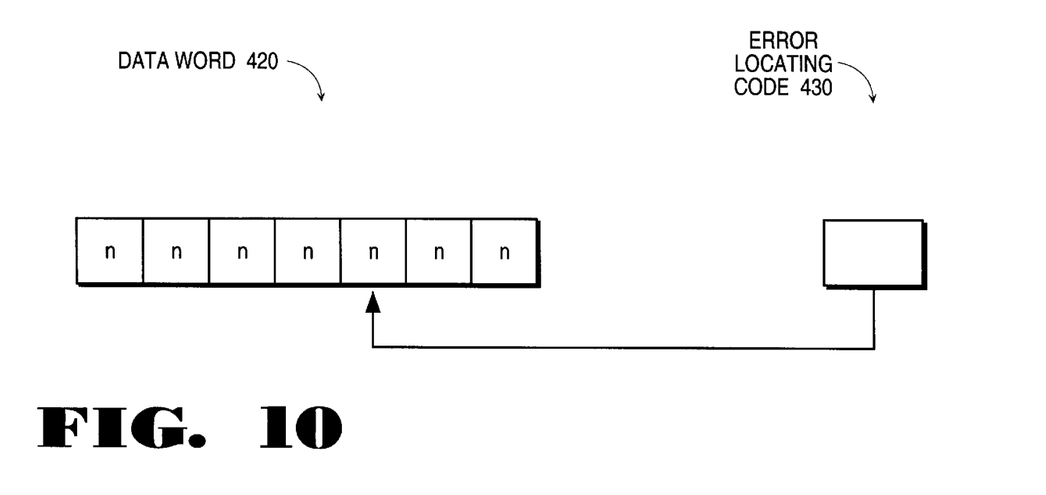
FIG. 10 shows a representative drawing of a data word and its associated error locating code.

FIG. 10 shows a representative drawing of a data word 420 and its associated error locating code 430. The error locating code 430 is decoded to point to an erroneous group of bits, also called a "byte," in the data word 420.

For one embodiment, each byte corresponds exactly to a single multilevel cell, i.e., each byte is comprised of the number of bits that is stored in a particular multilevel cell, and each byte is aligned with the multilevel cell boundaries. In this case, when the error locating code identifies an erroneous byte, it also identifies an erroneous multilevel cell. Because the failure mechanism of the multilevel cell is predictable based on charge loss, the correct state of the erroneous multilevel cell is predicted to be a charge state having more charge than the charge state read from the erroneous multilevel cell.

For another embodiment, the erroneous byte overlaps with two multilevel cells, i.e., part of the byte is stored in one multilevel cell, and part of the byte is stored in another multilevel cell. This may occur when the number of bits in the byte are not the same as the number of bits stored in a multilevel cell, or the byte is misaligned with respect to the multilevel cell boundaries. If overlap of two multilevel cells occurs, one or both cells associated with the erroneous byte may be corrected by predicting higher charge states of one or both of the two multilevel cells. Similarly, overlap of more than two multilevel cells may be corrected by predicting higher charge states of one or more of the erroneous multilevel cells.

Figure 11:
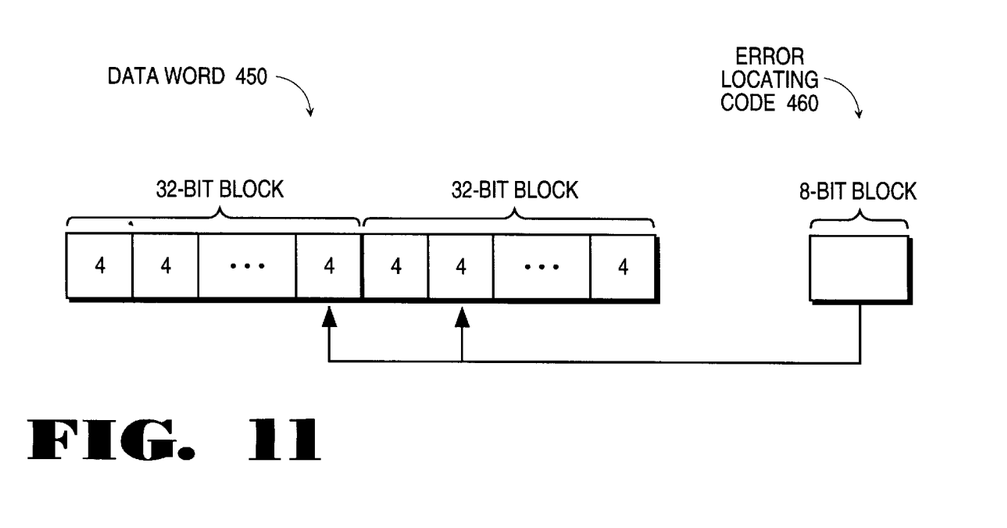
FIG. 11 shows an example of a 64-bit data word along with its associated 8-bit error locating code.

FIG. 11 shows an example of a 64-bit data word 450 along with its associated 8-bit error locating code 460. The error locating code 460 is a type of error locating code as described in Fujiwara. It can detect an n-bit byte that is erroneous. It can also detect a single bit error. FIG. 11 shows an example of the n=4 case. The data word is also divided into two 32-bit blocks. The 8-bit error locating code 460 is able to detect one 4-bit byte error in each of the 32-bit blocks.

Thus, if the data word is stored in a 4-bit multilevel cell memory (in which each cell would have 16 charge states), then each of the 4-bit bytes corresponds to a particular multilevel cell. If an error were detected in one of the 4-bit bytes, then the data read from the multilevel cell associated with the 4-bit byte is erroneous. Using the error locating codes, an erroneous multilevel cell can be determined within each block.

Multiple erroneous multilevel cells may be determined within the same data word, as is shown in FIG. 11 by the error locating code 460 pointing to two separate erroneous 4-bit bytes of the data word 450. The accuracy of the error correction varies dependent upon the number of erroneous bits and n-bit bytes as is described in the IEEE article by E. Fujiwara and M. Kitakami, cited previously. Various configurations of n-bit bytes, and m-bit blocks can be implemented to achieve the level of error location and correction performance desired.

Error locating codes have an advantage over error correction codes because fewer bits are required to implement them. This reduces the cost and the size of the memory array. For comparison, if an 8-bit Hamming code (a type of error correction code) were used in place of the error locating code 460, then only a single bit error in the data word 450 could be corrected. If a double bit error occurred in the data word 450, the double bit error would be detected but could not be corrected by the Hamming code. Thus, the error locating code 460 provides a better method of correcting errors in the data word than the error correction Hamming code.

Since a predominant failure mechanism for a multilevel cell is for the multilevel cell to lose charge, once an erroneous multilevel cell is determined, it is possible to predict that the erroneous multilevel cell should have a charge level higher than that of its current state.

Figure 12:
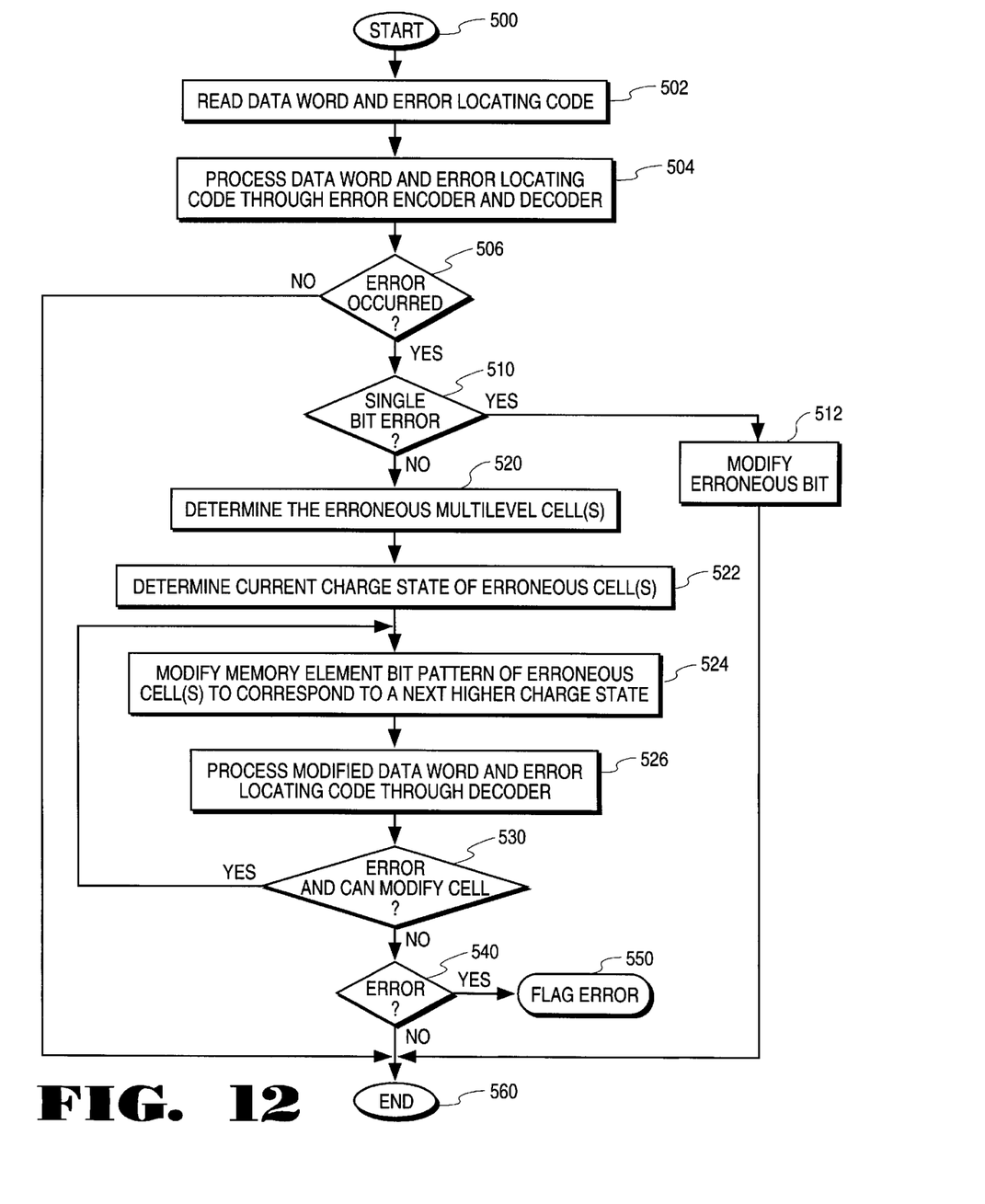
FIG. 12 shows a flowchart of the process of correcting errors detected by the error locating codes when reading a data word from a multilevel cell memory.

FIG. 12 shows a flowchart of the process of correcting errors detected by the error locating codes when reading a data word from a multilevel cell memory. The following description is made with reference to the read circuitry of FIG. 5. The flowchart starts at block 500, from which it continues at block 502. At block 502, a data word and its associated error locating code are read within the multilevel cell memory. The data word is held in the data buffer 320, and the error locating code is held in the error buffer 322.

At block 504, the data bits and the error locating codes are processed through the EED 324 to determine whether there is an error in the data word. The processing of the data bits and error locating codes carried out by the EED 324 can be implemented by well-known circuitry.

At block 506, if no error was detected, then operation continues at block 560, at which operation terminates. If, however, an error was detected, then operation continues at block 510.

At block 510, if the EED 324 detected a single bit error, then operation continues at block 512, at which the EED 324 corrects the single bit error within the data buffer 320 by asserting one of the signal lines 340 for altering the appropriate bit value of the data buffer 320. From block 512, operation continues at block 560, at which operation terminates.

If at block 510, however, the decoder detected a multi-bit byte error, such as a 4-bit byte error as was described with respect to FIG. 11, then operation continues at block 520. At block 520, the one or more erroneous multilevel cells storing part of the data word are determined. These erroneous multilevel cells are pointed to by the EED 324. At block 522, the current charge state of the erroneous cell(s) are detected by well-known circuitry in the multilevel cell prior art. At block 524, the memory element bit pattern corresponding to the erroneous cell(s) is modified to that of a next higher charge state. For one implementation, the directly next higher charge state from the current charge state is predicted as being the most likely corrective measure. For another implementation, a charge state different from the next higher charge state may be more likely to correct an error. For example, it may be experimentally found that a predominant error mode is for a particular charge state of a multilevel cell to skip down two states. In this case, the error can be corrected by predicting that the second next higher charge state from the charge state read is the most likely corrective measure. Similarly, if it were found that a particular failure mode were the only failure mode of a multilevel cell, the correction algorithm could be appropriately implemented to take only the needed corrective measures.

At block 526, the modified data word and the error locating code are processed through the EED 324 to see if the error has been corrected by the modification of the data word performed in block 524.

If there is still an error and the bits associated with the erroneous multilevel cell(s) can be modified again to a higher charge state, then operation proceeds from block 530 back to block 524. If, however, both the conditions of there still being an error and the memory element bit pattern associated with an erroneous multilevel cell not being able to be modified to a higher charge state are satisfied, then operation proceeds at block 540.

At block 540, if there is still an error in the data word, then operation proceeds at block 550, in which an error is flagged. The processor 200 or other device requesting the data word is informed that an error has occurred.

If, however, at block 540, an error is no longer detected, then operation continues at block 560.

At block 560, the flowchart terminates. The data buffer 320 holds a data word which has been corrected of errors. In one embodiment of a multilevel cell memory, the erroneous multilevel cell is rewritten with the corrected data word held in the data buffer 320. In other embodiments, however, a correction to the memory array is not made. This is due to the complexity of adding additional circuitry to write back to the memory array. Additionally, for a flash memory embodiment, generally, an entire block would have to be erased in order to rewrite a data word that has previously already been written to the flash memory.

In the foregoing specification, the invention has been described with reference to specific exemplary embodiments thereof. It will, however be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of reading data from a multilevel cell of a memory, the multilevel cell capable of storing three or more charge states, the method comprising the steps of:
   (a) determining that a first charge state read from the multilevel cell is erroneous by using an error locating code; and
   (b) providing an output corresponding to the multilevel cell maintaining a second charge state, wherein the second charge state has more charge than the first charge state, and wherein said first charge state results from a unidirectional charge loss within said multilevel cell from said second charge state.

2. The method of claim 1 wherein the second charge state is one charge state above the first charge state.

3. The method of claim 1 wherein the second charge state is two charge states above the first charge state.

4. A method of reading data from a memory comprised of multilevel cells, each of the multilevel cells storing more than one bit of data, the method comprising the steps of:
   (a) reading data bits stored in a set of multilevel cells;
   (b) reading error locating bits associated with the data bits;
   (c) using the error code bits to determine that the data bits read from the set of multilevel cells include target bits that are erroneous, wherein the target bits are associated with a target multilevel cell, and wherein the bits indicate that the target multilevel cell maintains a first charge state; and
   (d) modifying the target bits to correspond to the target multilevel cell maintaining a second charge state, wherein the second charge state maintains more charge than the first charge state, and wherein said first charge state results from a unidirectional charge loss within said multilevel cell from said second charge state.

5. The method of claim 4 further comprising the step of:

(e) determining whether the target bits that were modified in the step (d) are still erroneous, and if the target bits are still erroneous, then modifying the target bits to correspond to the target multilevel cell maintaining a third charge state, wherein the third charge state maintains more charge than the second charge state.

6. The method of claim 4 wherein the target bits are also associated with a second target multilevel cell, and wherein the target bits indicate that the second target multilevel cell maintains a fourth charge state, the method further comprising the step of:

(e) modifying the target bits to correspond to the second target multilevel cell maintaining a fifth charge state, wherein the fifth charge state maintains more charge than the fourth charge state.

7. A method of reading data from a multilevel cell memory comprising the steps of:

(a) accessing a codeword in the multilevel cell memory, the codeword comprising a predetermined number of data bits and a predetermined number of error locating bits;

(b) using the error locating bits to determine that a portion of the predetermined number of data bits is incorrect, the portion of the predetermined number of data bits corresponding to a first multilevel cell actually maintaining a first charge state; and (c) modifying the portion of the predetermined number of data bits associated with the first multilevel cell to correspond to a higher charge state than the first charge state, and wherein said first charge state results from a unidirectional charge loss within said multilevel cell from said higher charge state.

8. The method of claim 7 further comprising the step of:

(d) checking for an error in the predetermined number of data bits that were modified in the step (c); and (e) modifying the portion of the predetermined number of data bits associated with the first multilevel cell to correspond to a next higher charge state until the error has been corrected.

9. A circuit comprising:

a memory array comprising a plurality of multilevel cells capable of storing at least two bits of data each; and an error circuit coupled to receive the data from the memory array, the error circuit comprising a decoder capable of correcting an erroneous memory element bit pattern provided by one of the multilevel cells, the decoder predicting a correct memory element bit pattern based on a unidirectional charge loss associated with the erroneous memory element bit pattern.

10. The circuit of claim 9 further comprising:

a data buffer capable of storing the erroneous memory element bit pattern, the data buffer allowing an input from the decoder for modifying individual bits stored within the data buffer.

11. A memory comprising:

a multilevel cell capable of storing at least two bits of data;

an error code generator for generating an error locating code associated with the at least two bits of data of the multilevel cell; and an error code decoder for determining whether there is an error resulting from a unidirectional charge loss within said multilevel cell when retrieving the at least two bits of data from the multilevel cell.

12. The memory of claim 11 further comprising:

a data buffer coupled to the error code decoder for storing the at least two bits of data, the data buffer allowing bits stored within it to be modified.

13. A memory comprising:

an array of multilevel cells for storing a data word, each multilevel cell capable of storing three or more charge states; and error correction circuitry comprising first circuitry that employs error locating codes associated with the data word to locate an erroneous multilevel cell, and second circuitry for providing a memory output associated with the erroneous multilevel cell, wherein the memory output corresponds to a charge state higher than that read from the erroneous multilevel cell, and wherein a charge state associated with said erroneous multilevel cell results from a unidirectional charge loss within said multilevel cell.

* * * * *